Dec. 31, 1968 MINORU ONO 3,419,766
METHOD OF PRODUCING INSULATED GATE FIELD EFFECT
TRANSISTORS WITH IMPROVED CHARACTERISTICS
Filed Aug. 31, 1966

INVENTOR.
MINORU ONO
BY
H. Edward Maslern

United States Patent Office 3,419,766
Patented Dec. 31, 1968

3,419,766

METHOD OF PRODUCING INSULATED GATE FIELD EFFECT TRANSISTORS WITH IMPROVED CHARACTERISTICS

Minoru Ono, Tokyo-to, Japan, assignor to Kabushiki Kaisha Hitachi Seisakusho, Tokyo-to, Japan, a joint-stock company of Japan Continuation-in-part of application Ser. No. 376,149, June 18, 1964. This application Aug. 31, 1966, Ser. No. 576,415
Claims priority, application Japan, June 24, 1963, 38/32,674
10 Claims. (Cl. 317—235)

ABSTRACT OF THE DISCLOSURE

A method of making insulated gate type field effect transistors including a step of heat-treatment above 70° C. but at a temperature which will not damage the transistor while applying across the insulating film interposed between the gate electrode and the channel of the field effect transistor a direct current field whose magnitude varies uniformly along the channel. The transistor thus treated possesses a channel having a nonuniform conductance distribution when no operating voltage is impressed on the gate electrode.

This application is a continuation-in-part of prior application Ser. No. 376,149, filed in June 18, 1964, in the name of Minoru Ono, entitled "Method for Treatment of Semiconductor Substrates," and now abandoned.

This invention relates to a semiconductor element, in which a surface of a semiconductor substrate is covered with an insulating film and a method for treating the same. More particularly, this invention concerns a new method for treating insulated gate type field effect transistors.

It has been known that, when an insulating oxide film is formed on a semiconductor monocrystalline substrate, the conductivity type or the conductivity of the surface portion of said substrate beneath said oxide film is varied. For example, in case the semiconductor substrate is a silicon monocrystal of a low doped P conductivity type and covered with a silicon dioxide film, the conductivity type of the surface portion of said substrate contacting the silicon dioxide is inverted to N conductivity type. While, in the case in which the substrate is of N conductivity type, a high $N^+$ conductivity type region appears in the surface portion of the substrate beneath the silicon dioxide.

The phenomenon described hereinbefore is advantageously applied to an insulated gate type field effect transistor, in which the source region and the drain region are mutually connected through the inversion layer or a channel induced by the silicon dioxide film covering the semiconductor substrate.

In the insulated gate type field effect transistor of the prior art, the conductance of said channel distributes uniformly. However, an insulating gate type field effect transistor having much better characteristics has been expected, wherein a nonuniform distribution of channel is realized.

Therefore, it is a general object of the present invention to provide a method for realizing a field effect semiconductor element having a current path in the surface portion of a semiconductor substrate covered with an insulating film, in which the conductance, that is, thickness or conductivity (specific conductance) of the current path distributes nonuniformly along the current path.

According to the present invention, a semiconductor element is heat-treated by applying, through the insulating film covering the semiconductor substrate, a field such as having a direction perpendicular to the surface of said substrate and distributing nonuniformly along the current path.

The specific nature and details of the invention will be more clearly apparent by reference to the following detailed description with respect to one embodiment of the invention as applied to the production of field effect semiconductor devices, when read in conjunction with the accompanying drawings in which like parts are designated by like reference characters, and in which.

Figures 1, 2, 3:
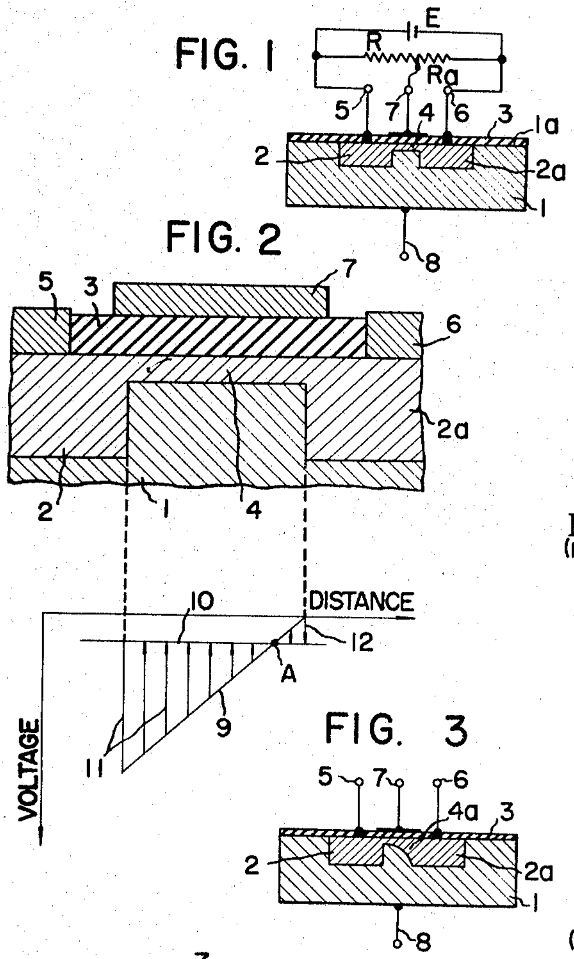
FIG. 1 is a diagrammatic sectional view, in conjunction with a circuit diagram, indicating one embodiment of the method of treatment according to this invention.
FIG. 2 is an enlarged diagram of a semiconductor substrate shown in FIG. 1 in which a state of electric field applied on the insulating film is illustrated.
FIG. 3 is a diagrammatic sectional view showing one example of a semiconductor device obtained by the method of the present invention.
Figure 4A:
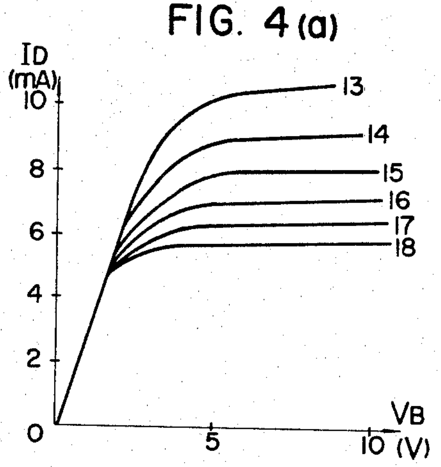
Figure 4B:
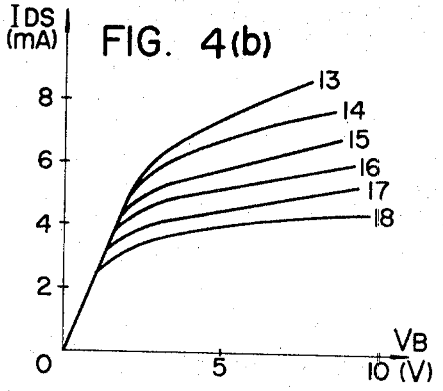
Figure 5:
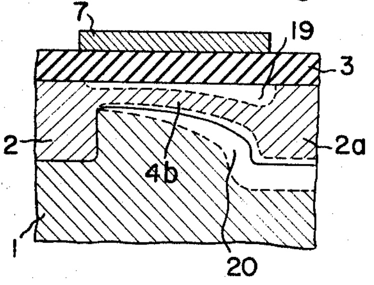
Figure 6:
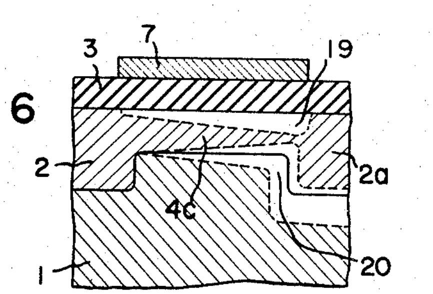

FIGS. 4*a* and 4*b* are graphical representations respectively indicating characteristics curves of the semiconductor device shown in FIG. 3;

FIGS. 5 and 6 are partial cross-sectional views explaining operating conditions of semiconductor devices in which the former is subjected to treatment according to this invention and the latter is not.

Figure 7:
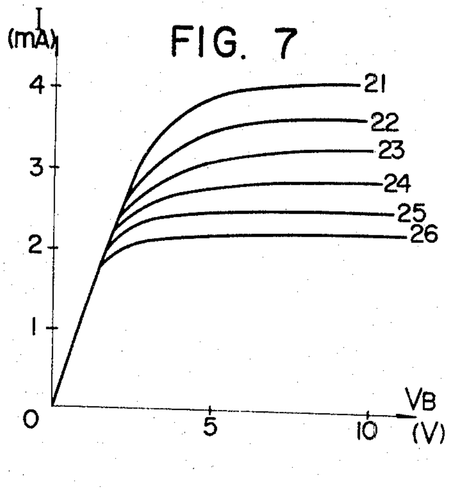

FIG. 7 shows characteristic curves of a semiconductor device prior to being treated by the method of this invention.

Referring to FIGURE 1, the field effect semiconductor device comprises a semiconductor substrate 1 such as silicon or germanium of one conductivity type, a pair of regions 2 and $2_a$ of another conductivity type opposite to said one conductivity type of the semiconductor substrate formed in one surface $1_a$ of the substrate 1, an insulating film 3 such as, for example, a silicon dioxide film, formed on the surface $1_a$, and a current path 4 formed beneath the insulating film 3 and between the pair of regions 2 and $2_a$ in the form of a thin layer, as mentioned hereinbefore, which constitutes a channel layer.

The semiconductor assembly as described above is further provided with source and drain electrodes 5 and 6 connected respectively to the regions of the opposite conductivity type 2 and $2_a$. In addition, there are provided a first gate electrode 7 formed on and secured to the outer surface of the insulating film 3 over an area thereof facing and covering the channel layer 4 and a second gate electrode 8 connected to the substrate 1 (in the case illustrated, on the surface thereof opposite to the surface $1_a$).

In case said semiconductor substrate is a high resistivity P type silicon and said insulating film is a silicon dioxide, a channel layer of N conductivity type induced by the dioxide film is formed in the surface portion of the substrate between said pair of region of N type conductivity in the state wherein a bias voltage is not applied to the gate electrodes. On the other hand, in case said semiconductor substrate is of a N type conductivity, a channel layer is not formed between said pair of regions of P type conductivity in the state wherein a bias voltage is not applied to the gate electrodes. In this case, in order to form a channel layer between said pair of regions, a suitable bias voltage is to be applied to the first gate electrode.

For explanation, a P type silicon monocrystal having a resistivity of 2 ohm-cm., 200-micron in thickness, 500-micron in width and 2000-micron in length is selected as the substrate 1. By an ordinary diffusion method, an N type impurity, for example, phosphorus, is selectively diffused into the substrate 1 to provide the pair of regions 2 and $2_a$ having 100-micron in width and 5-micron in depth and a mean resistivity of 0.05 ohm-cm. with a space therebetween of 30 microns in the surface. The insulating film 3 is a silicon dioxide grown on the surface of the substrate 1 and has a thickness of 3000 angstroms.

According to the invention a field effect semiconductor device of the above described construction is subjected to the following treatment. Referring again to FIGURE 1, a direct current voltage source E providing 4 volts, for example, is connected between the source and drain electrodes 5 and 6 in the direction wherein the source electrode 5 is caused to be positive. The voltage in the channel 4 decreases progressively as it leaves away from the source region 2, because said voltage source E causes a current to flow in the channel 4 from the source region 2 to the drain region $2_a$. A variable resistor R connected in parallel with the voltage source E has a slider R*a* which is connected to the gate electrode 7. The position of this slider R*a* on the resistor R is so set that the ratio of its distances to the points corresponding to the source electrode 5 and the drain electrode 6 become, for example, 6:1. Accordingly, the voltage at the gate electrode 7 with respect to the drain electrode 6 is about 0.6 volt.

The distribution of a field applied to the silicon dioxide film 3 is shown in FIGURE 2, in which the reference numeral 9 indicates distribution of voltage within the channel 4, and the numeral 10 denotes voltage at the gate electrode 7. As can be seen from this drawing, a field 11 shown with arrow marks directed from the channel 4 to the gate electrode 7 is impressed on the silicon dioxide film at the side of the source region, i.e., at the left side of the point A in the drawing. The magnitude of this electric field continuously varies so that it attains a maximum at the side of the source region and a minimum at the point A. On the other hand, an electric field 12 directed from the gate electrode 7 to the channel 4 is impressed on the silicon dioxide film at the side of the drain region, i.e., at the right side of the point A in the drawing, the magnitude of which is at a minimum at the point A and gradually increases as the drain region $2_a$ is approached. The semiconductor device of the above-described state is then subjected to a heat-treatment for 30 minutes at a temperature of, for example, 350 degrees C.

The method for controlling the surface density of the carrier induced to the semiconductor surface beneath the insulating film by heat-treating the semiconductor element while applying an electric field thereto through the insulating film covering the surface of the semiconductor substrate is clearly disclosed in the pending U.S. patent application No. 372,350 entitled "Method for Producing Semiconductor Device." The mechanism of this method of treatment has not yet been completely clarified, but it can be outlined as follows. The insulating film which covers the surface of the semiconductor substrate contains a very small quantity of positive ion such as $Na^+$, etc., or any other electric charge. This positive charge is supposed to attract electric carriers or electrons to the surface of the semiconductor substrate, thereby varying the conductivity type of the surface part of the semiconductor or specific conductance. The method as disclosed in the above-mentioned pending application is directed to control the quantity of the electric carrier (which is usually denoted in terms of surface carrier density or surface donor density) induced in the surface of the semiconductor substrate beneath the insulating film by first causing the above-mentioned electric charge to be mobile through heat-treatment of the semiconductor substrate to a relatively high temperature, then shifting this mobilized electric charge to a predetermined position by means of the electric field impressed on the above-mentioned insulating film, and thereafter cooling the semiconductor substrate. That this phenomenon is entirely based on the existence of the insulating film can be proved from the fact that the above-mentioned inversion layer disappears when the insulating film is removed from the surface of the semiconductor substrate.

In addition, as the density of the carrier electron induced in the surface of the semiconductor substrate beneath the insulating film can be equivalently converted to the density of donor impurity, the surface carrier density is also represented at times in terms of the surface donor density. In this heat-treatment, the heating temperature should be at least 70° C. or, preferably, 250° C. and above. The heating time is desirably more than 10 minutes. As to the strength of electric field, it can be said that the stronger the field is, the shorter becomes the time required for heat-treatment, though an appropriate strength thereof should be chosen in order not to cause dielectric breakdown of the insulating film.

In the present invention, when the above-described heat-treatment of the semiconductor element is conducted applying to the insulating film a nonuniform, continuously varying electric field, the density of the carrier electrons attracted to the surface of the semiconductor body due to the insulating film is distributed nonuniformly in the semiconductor substrate in accordance with the non-uniformly distributed electric field. That is, as shown in FIG. 3, the cross-sectional area or surface donor density of the channel 4 is small at the side of the source region 2 and is large at the side of the drain region $2_a$; in other words, it is nonuniformly distributed so as to gradually vary along the direction of the current path. Thus, the degree of nonuniformity of this conductance can be controlled since, as described above, the effective channel layer and its configuration can be selected arbitrarily depending on the voltage applied to the source and drain electrodes. Accordingly, a field-effect semiconductor device having a channel layer $4_a$ of nonuniform conductance distribution as indicated in FIGURE 3 can be obtained.

In general, the characteristics of an insulated gate type field-effect semiconductor device undergo almost no change when its source and drain electrodes are interchangeably reversed, that is, when the source electrode is used as the drain electrode, and the drain electrode is used as the source electrode. In the device produced by the treatment of this invention, however, such reversal of electrodes gives rise to a remarkable difference in the characteristics. This difference confirms the asymmetric nature of the thickness or the surface carrier density of the channel layer. One example of this difference is illustrated in FIGURES 4(*a*) and 4(*b*), which indicate characteristics exhibited by the device shown in FIGURE 3 when it is operated in the following manner. The characteristics indicated in FIGURE 4(*a*) are those obtained by shorting the source electrode 5 and the second gate electrode 8, impressing a D-C voltage $V_B$ across the source electrode 5 and the drain electrode 6 in the direction of causing the source electrode to become negative, thereby causing a drain current $I_D$ to flow, impressing a D-C gate bias voltage $V_g$ across the source electrode 5 and the gate electrode 7 similarly in the direction of causing the source electrode 5 to become negative, and varying the D-C gate bias voltage $V_g$, so as to vary the drain current $I_D$. (The ordinate of the graph in FIGURE 4(*a*) represents drain current $I_D$, and the abscissa represents voltage $V_B$ between the source and drain electrodes.)

On the other hand, the characteristics indicated in FIGURE 4(*b*) are those obtained by shorting the drain electrode 6 and the second gate electrode 8, impressing a D-C voltage $V_B$ across the source electrode 5 and the drain electrode 6 in the direction of causing the source electrode to become positive, thereby to cause the flow of a drain current $I_{DS}$ resulting from the use of the source electrode 5 as the drain electrode, impressing a D-C gate bias voltage $V_g$ across the drain electrode 6 and the gate electrode 7 in the direction of causing the drain electrode 6 to become negative, and varying the D-C gate bias voltage $V_g$, so as to vary the drain current $I_{DS}$. (The ordinate of the graph in FIGURE 4(*b*) represents drain current $I_{DS}$ resulting from the use of the source electrode 5 as the drain electrode, and the abscissa represents voltage $V_B$ between the source and drain electrodes.)

In FIGURES 4(*a*) and 4(*b*), the curves designated by reference numerals 13, 14, 15, 16, 17, and 18 respectively indicate characteristics corresponding to the values of D-C gate bias voltage $V_g$ of 0, −0.2, −0.4, −0.6, −0.8, and −1.0 volt. It is apparent also from these characteristics curves that the conductance distribution in the channel layer is nonuniform. The mutual conductance $g_m$ (the ratio of the output current variation with respect to the input voltage variation, a high value of which is desirable) of this device is 5.7 milli-mho in case it is used in compliance with the characteristics as indicated in FIGURE 4(*a*).

Since the insulated gate type field effect transistor obtained by the method of this invention as shown in FIG. 3 possesses nonuniform conductance distribution when no bias voltage is impressed on the respective electrodes, the conductance of the effective channel $4_b$ defined by the depletion layers 19 and 20 as shown in FIG. 5 is substantially uniform in the operating conditions, whereby a device having large value of $g_m$ can be obtained.

The operating conditions of a transistor prior to the treatment according to this invention are as shown in FIG. 6, wherein the conductance of the effective channel $4_c$ defined by the depletion layers 19 and 20 is nonuniform. The electrical characteristics of this device are indicated by FIG. 7, in which the ordinate represents drain current $I_D$, and the abscissa represents voltage $V_B$ between the source and drain electrodes. The curves designated by reference numerals 21, 22, 23, 24, 25, and 26 indicate characteristics corresponding respectively to the values of the D-C gate bias voltage $V_g$ between the source and gate electrodes of 0, −0.2, −0.4, −0.6, −0.8, and −1.0 volt. In this case, the value of $g_m$ is 1.7 milli-mho.

In the above-described example, an explanation has been made with respect to a case wherein a channel 4 has already been formed before a bias voltage is impressed on the insulated gate electrode 7. However, when the method of treatment according to this invention is to be applied to a device of a type such that no channel is formed before bias voltage is impressed on the insulated gate electrode 7 and the current commences to flow at first when a predetermined voltage is supplied to the gate electrode 7, it is indispensable for imparting a nonuniform electric field to the insulating film 3 that an appropriate value of bias voltage be applied to the gate electrode 7 at the same time.

For the insulating film 3 to be interposed between the gate electrode 7 and the semiconductor substrate 1, it is possible to use silicon dioxide deposited by thermal decomposition of organooxy-silane instead of the aforementioned thermally grown silicon dioxide. The thickness of the dioxide film can be selected properly in accordance with the purpose. In the insulated gate type field effect transistor, this film thickness should not be too great, but about a few thousands angstroms is generally recommendable to increase the value of $g_m$.

It can be readily observed from the above description that a semiconductor device which has been treated by the method according to the present invention has far superior characteristics to those of a semiconductor device which has not been so treated.

While the foregoing description has been presented with respect to an embodiment of the invention as applied to a field-effect semiconductor device, it will be obvious that the method of this invention can be applied with equal effectiveness to other semiconductor devices. Furthermore, a semiconductor layer of any type of conductivity may be used for controlling the conductivity type of the surface of the semiconductor substrate.

Although this invention has been described with respect to a particular embodiment thereof, it is not to be so limited as changes and modifications may be made therein which are within the full intended scope of the invention, as defined by the appended claims.

What is claimed is:

1. A field effect device comprising a semiconductor substrate, a current path defined in the surface of said semiconductor substrate, and an insulating film formed on the surface of said semiconductor substrate at least to cover said current path, said current path containing induced carriers attracted by said insulating film and the density of said induced carriers being distributed nonuniformly along said current path in the unenergized state of said device.

2. The device, as defined in claim 1, further comprising an electrode formed on said insulating film to cover said current path.

3. The device as defined in claim 1, in which said insulating film consists essentially of silicon dioxide.

4. A field effect semiconductor device comprising a semiconductor substrate of a first conductivity type, a pair of diffused regions formed in a said semiconductor substrate to expose to a common surface of said semiconductor substrate, a current path defined in said common surface between said pair of diffused regions, an insulating film formed on said common surface at least to bridge and contact to said pair of diffused regions, and an electrode formed on said insulating film to cover said current path, said current path including induced carriers attracted by said insulating film and the surface density of said induced carriers being distributed along said current path varying progressively from a higher value at one end portion of said current path to a lower value at the other end portion thereof in the unenergized state of said device.

5. The field effect semiconductor device as defined in claim 4, in which said insulating film consists essentially of silicon dioxide.

6. In a field effect transistor comprising a semiconductor substrate of a first conductivity type, source and drain electrodes disposed on one surface of said substrate, a current path defined in said surface, said current path leading from said source electrode to said drain electrode, an insulated gate electrode disposed on said current path, and an insulating film interposed between said substrate and said gate electrode to cover said current path, an improvement wherein the density of electric carriers induced by said insulating film therebelow is gradiently distributed along said current path in the unenergized state.

7. A method of treating field effect elements including a semiconductor substrate and an insulating film formed on at least one part of a surface of said semiconductor substrate which comprises: applying across said insulating film a direct current field having the direction perpendicular to the surface of said semiconductor substrate covered with said insulating film and the magnitude being distributed nonuniformly along a direction parallel to the surface of said semiconductor substrate; and heat-treating said field effect element under application of said field at a temperature of more than 70° C. but not high enough to damage said semiconductor substrate and said insulating film.

8. A method of treating insulated gate type field effect elements including a semiconductor substrate, an insulating film formed on at least one part of a surface of said semiconductor substrate, a current path defined in the surface portion of said semiconductor substrate beneath said insulating film, and an electrode formed on said insulating film to cover said current path, which comprises: applying a direct current voltage between both ends of said current path to cause an electric current to flow through said current path, simultaneously applying a direct current voltage lower than a breakdown voltage of said insulating film between said electrode and said current path, and heat-treating said field effect element under application of said voltages at a temperature of more than 70° C. but not high enough to damage said semiconductor substrate and said insulating film.

9. A method of treating insulated gate type field effect elements including a semiconductor substrate of a first conductively type, a pair of diffused regions of a second conductivity type opposite to said first conductivity type formed in the surface of said semiconductor substrate and spaced from each other, an insulating film formed on said surface at least to bridge and contact to said pair of diffused regions, and an electrode formed on said insulating film to cover the surface of said semiconductor substrate between said pair of diffused regions, which comprises: applying a direct current voltage lower than a breakdown voltage of said insulating film between said electrode and one of said pair of diffused regions; simultaneously applying a direct current voltage between said pair of diffused regions; and heat-treating said field effect element under application of said voltages at a temperature of more than 70° C. but not high enough to damage said semiconductor substrate and said insulating film.

10. A method of treating insulated gate type field effect elements including a semiconductor substrate of a predetermined conductivity type, and an insulating film adhering film adhering to at least one part of a surface of said semiconductor substrate, which comprises a step of heat-treating said field effect elements at a temperature more than 70 degrees C. but not high enough to damage said field effect element under application of a direct current electric field across said insulating film, said electric field being created by a voltage between potentials imparted to both major face sides of said insulating film, the magnitude of the potential imparted to one major face side of said insulating film being distributed so as to vary progressively along a direction parallel to said insulating film from a larger value to a smaller value.

References Cited

UNITED STATES PATENTS

| | | | |
|---|---|---|---|
| 3,102,230 | 8/1963 | Dawon Kahng | 323—94 |
| 3,206,670 | 9/1965 | Atalla | 323—93 |

JOHN W. HUCKERT, *Primary Examiner.*

R. SANDLER, *Assistant Examiner.*

U.S. Cl. X.R.

29—571